United States Patent [19]

Golio et al.

[11] Patent Number: 5,001,524
[45] Date of Patent: Mar. 19, 1991

[54] DIGITALLY CONTROLLED FIELD EFFECT ATTENUATOR DEVICES

[75] Inventors: John M. Golio; Janet R. J. Golio; Joseph Staudinger, all of Chandler, Ariz.

[73] Assignee: Motorola, Inc., Schaumburg, Ill.

[21] Appl. No.: 361,470

[22] Filed: Jun. 5, 1989

[51] Int. Cl.$^5$ ............... H01L 29/80; H01L 29/48; H01P 1/22; H02K 5/08
[52] U.S. Cl. ................................. 357/22; 357/15; 333/81 R; 307/568
[58] Field of Search ............... 357/22 G, 22 J, 15; 333/81 A, 81 R; 307/568, 550

[56] References Cited

U.S. PATENT DOCUMENTS

| | | | |
|---|---|---|---|
| 4,511,813 | 4/1985 | Pan | 330/277 |
| 4,734,751 | 3/1988 | Hwang et al. | 357/41 |
| 4,875,023 | 10/1989 | Maoz | 307/550 |

Primary Examiner—Rolf Hille
Assistant Examiner—Robert P. Limanek
Attorney, Agent, or Firm—Maurice J. Jones

[57] ABSTRACT

A variable field effect attenuator suitable for providing digitally controlled attenuation characteristic is disclosed. The attenuator can include a first semiconductor region connected in a series path between the input and output terminals and at least one shunt semiconductor region connected between the series path and a reference potential conductor. First gate electrodes are arranged to operate with the series semiconductor region and second gate electrodes are arranged to operate with the shunt semiconductor region. Gate electrode control lines are connected to selected gate electrodes so that digital signals can be selectively applied to the gate electrodes to render the semiconductor material associated therewith either conductive or nonconductive to provide a plurality of predetermined amounts of attenuation between the input and output terminals in response to a digital code.

15 Claims, 3 Drawing Sheets

DIGITALLY CONTROLLED FIELD EFFECT ATTENUATOR DEVICES

CROSS REFERENCE TO A RELATED PATENT APPLICATION

The subject matter of the present application is related to the subject matter of a patent application entitled "DIGITAL-TO-ANALOG CONVERTING FIELD EFFECT DEVICE AND CIRCUITY" having a filing date of MAY 1, 1989 and a serial number of 345,746, and which is assigned to the same assignee as the present application.

BACKGROUND OF THE INVENTION

The subject invention relates generally to attenuator circuitry and particularly to variable attenuator devices employing field effect technology.

Present day electronic applications often require the utilization of attenuator circuits or components which are responsive to control signals to vary the amount of resistance provided thereby. Such attenuators are useful for automatic gain control circuits, position locating systems, telephone systems, television systems, etc.

Prior art, electronically variable solid state attenuators for use at Radio Frequencies (RF) typically employ PIN diodes. PIN diode attenuators may be arranged in a variety of network configurations. Biasing control circuitry which include Field Effect Transistors (FETs) have been utilized to bias the PIN diodes in response to various analog control signal magnitudes, thereby causing the PIN diode network to provide any one of a variety of resistance magnitudes. Discrete PIN diode attenuators are capable of outstanding performance but require an undesirable amount of electrical power for some applications. Moreover, PIN diodes are not easily integrated into monolithic circuitry.

Other prior art approaches providing electronically variable attenuators sometimes utilize FETs such as gallium arsenide (Ga As) Metal Semiconductor Field Effect Transistors (MESFETs). These devices also may be arranged in a variety of networks and each device may operate without bias and therefore consume almost no electrical power except during switching operations. Analog control signals are applied to the gates of these devices to adjust the attenuation level. The resistance magnitude provided by each FET is controlled by controlling the depth of the undepleted channel in the device. Unfortunately, such variation of the depth of the undepleted channel tends to result in a nonlinear transfer characteristic which provides high intermodulation levels between RF signals applied thereto. This causes the generation of unwanted frequency components. To minimize such harmonic distortion, some prior art attenuators utilize further circuit elements connected to the attenuating FETs. This increase in circuitry undesirably increases cost, size, weight and undesirably decreases the reliability of such prior art attenuators. Moreover, these prior art attenuators require precise control of the magnitudes of the analog control signals. Such precision is difficult to achieve because analog signal magnitudes tend to drift with temperature, age of the semiconductors, variations of process parameters from device to device, etc.

Monolithic Microwave Integrated Circuits (MMIC) applications using GaAs semiconductor material are presently being developed because of the high frequency handling capabilities and the small size of such circuits. These applications require electronically variable attenuators which are compatible with the presently available MMIC semiconductor fabricating processes. The aforementioned prior art attenuators tend to be too expensive to fabricate, take too much space and/or have an unduly high failure rate for some of these applications. Also, some complex prior art attenuators utilizing analog control signals tend to operate too slowly to take advantage of the inherent speed characteristics of MMIC circuitry.

SUMMARY OF THE INVENTION

Accordingly, it is an object of the present invention to provide electronically variable attenuators which are capable of high speed, digitally controlled operation.

Another object of the invention is to provide variable attenuators which are compatible with MMIC applications and which can be provided in monolithic integrated circuit form.

An electronically variable field effect attenuator in accordance with an embodiment of the invention includes a series semiconductor region providing a series signal path between an input electrode and an output electrode. A first set of gate electrodes are arranged to operate with the series semiconductor region. These gate electrodes control the magnitude of the resistance provided between the input and output electrodes. At least one shunt semiconductor region can be connected between the input electrode or the output electrode and a reference potential conductor. A second set of gate electrodes are arranged to operate with the shunt semiconductor region to control the magnitude of the resistance provided from the series signal path to the reference potential conductor.

Gate electrode control lines are coupled to selected gate electrodes of the first and/or second sets of gate electrodes. These control lines selectively apply digital control signals in the form of "1's" or "0's" to selected gate electrodes to control the conductivity of the gate regions associated with the gate electrodes to thereby control the magnitude of the attenuation provided by the attenuator. The gate electrodes in each set can have different widths to tailor the resulting attenuation characteristic to meet the needs of particular applications.

BRIEF DESCRIPTION OF THE DRAWING

A more complete understanding of the present invention may be derived by reference to the detailed description and the claims considered along with the accompanying drawings wherein like reference numbers designate similar parts.

DETAILED DESCRIPTION OF THE PREFERRED EMBODIMENTS

Figure 1:
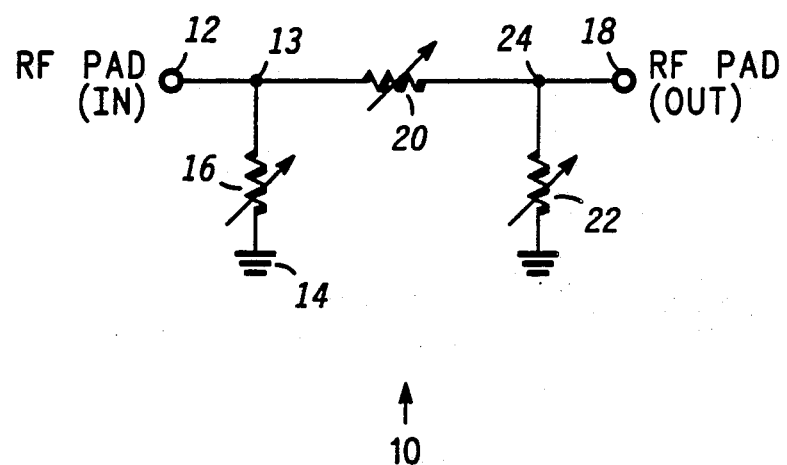
FIG. 1 is a schematic diagram of a Pi attenuator network.

FIG. 1 is a schematic diagram of a Pi attenuator network 10. RF signals to be attenuated are applied to input pad or terminal 12 which is electrically connected through node 13 to ground or reference potential conductor 14 by variable shunt resistive element 16 and to output pad or terminal 18 by series variable resistive element 20. A further shunt variable resistive element 22 electronically connects node 24 to ground conductor 14.

Figure 2:
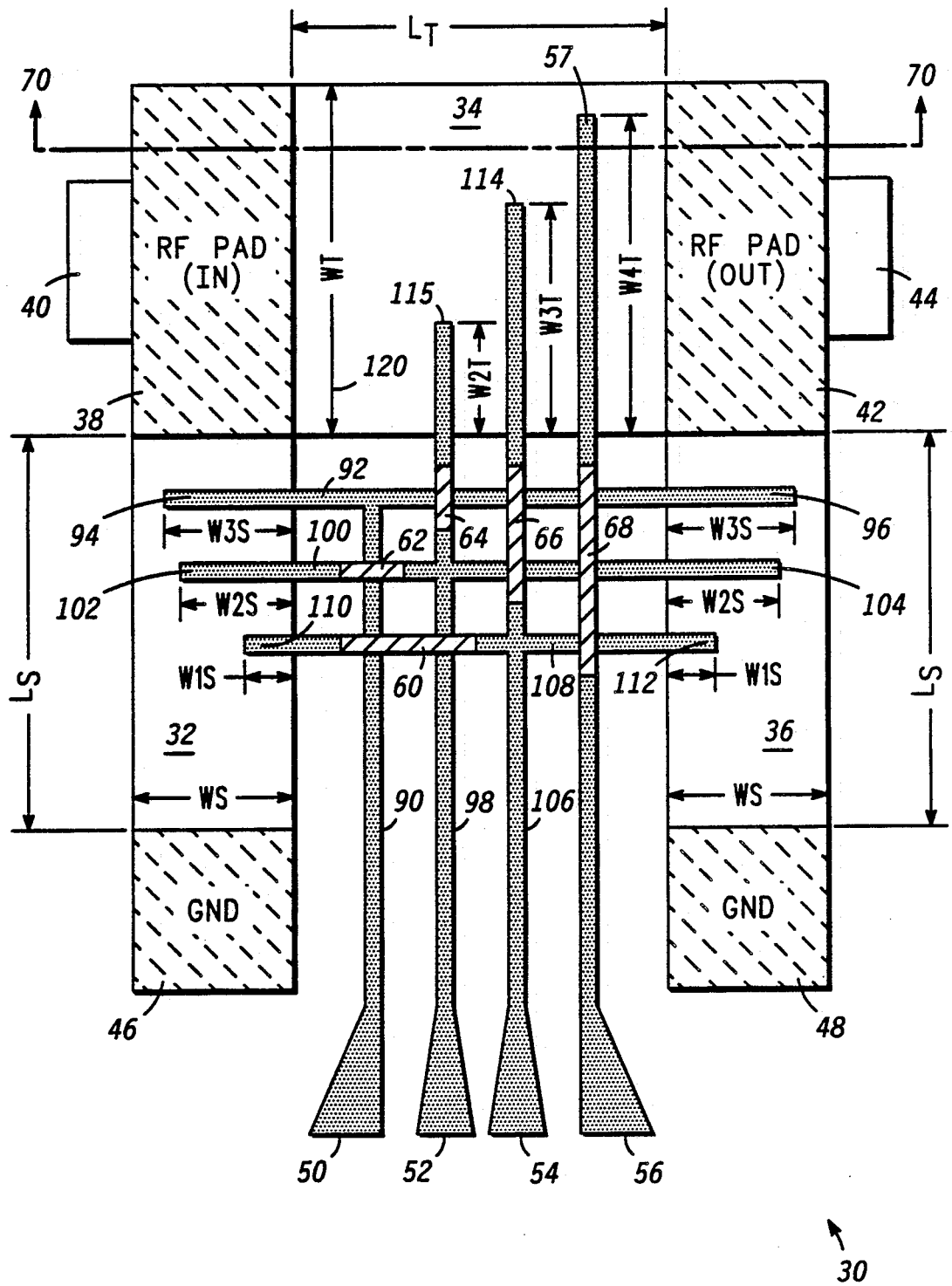
FIG. 2 is a top view of an embodiment of a field effect attenuator.

FIG. 2 illustrates a top view of the layout of one possible realization of an electronically variable field effect attenuator device 30 in accordance with one embodiment of the invention. Device 30 provides a variable attenuator circuit or network having the Pi configuration 10 schematically illustrated in FIG. 1. Digitally controlled RF attenuator device 30 functions as a matched attenuator. The amount of RF attenuation is selected using a digitally coded signal. Discrete levels of attenuation may be selected depending on the arrangement of the digital "1's" an "0's" of the digital signal applied to device 30. Device 30 may be fabricated using a plurality of different technologies including standard silicon or GaAs fabrication techniques. For many microwave circuit applications, it will be useful to fabricate device 30 in depletion mode GaAs MESFET technology. This technology is compatible with MMIC fabrication approaches.

More specifically, device 30 is comprised of three semiconductor resistive regions or elements 32, 34 and 36 which respectively correspond to resistors, 16, 20 and 22 of FIG. 1. Ohmic contact 38 which is connected to input pad 40 and to one end of input shunt resistive element 32, corresponds to node 13 of FIG. 1. Moreover, ohmic contact 42, which is connected to the other end of series resistive element 34 and to one end of output shunt resistive element 36, generally corresponds to node 24 of FIG. 1. Output pad 44 is also connected to ohmic pad 42.

Semiconductor resistive shunt regions 32 and 36 are terminated by respective ohmic contact metallizations 46 and 48. The electrical ground connection may be established either by a direct via hole connection through the semiconductor substrate of device 30 or by wire bonds from ground conductors 46 and 48 to an electrical ground conductor.

Control lines 50, 52, 54 and 56 are connected to various gate electrodes of the semiconductor resistor elements 32, 34 and 36. Cross hatched areas 60, 62, 64, 66 and 68 indicate "air gap" crossover structures for the control lines. Each crossover assures that the control lines do not make electrical contact to each other at the aforementioned crossover areas. Although four gate control lines are illustrated in FIG. 2, larger or smaller numbers of control lines are easily accomplished. The practical limit to the number of control lines is determined by the particular fabrication technology being utilized.

Figure 3:
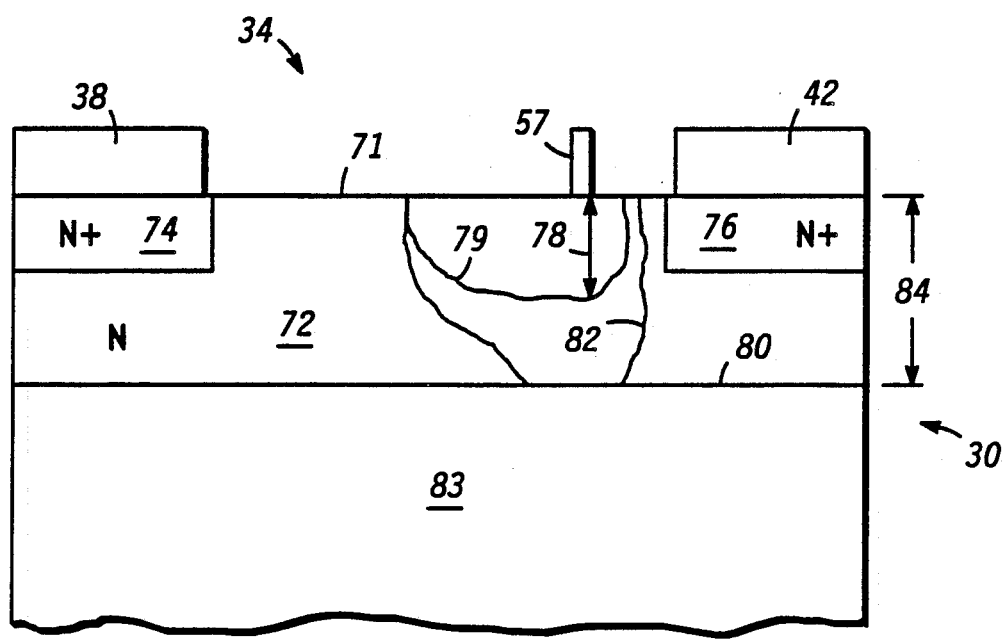
FIG. 3 is a cross-sectional view of the field effect attenuator of FIG. 1.

FIG. 3 indicates a cross section of device 30 along lines 70 of FIG. 2. More specifically, ohmic contacts 38 and 42 are located on surface 71 of semiconductor 72 of resistive element 34. Rectangle 57 indicates the cross section of gate electrode 57 which is integral with control line 56. Active N channel semiconductor layer 72 also supports ohmic contacts 38 and 42 and rectifying Schottky gate electrode contact 57. Regions 74 and 76 are N+ areas provided by known processes under each of ohmic contacts 38 and 42.

Schottky gate electrode 57 can be provided in a known manner by utilizing a proper combination of metals such as tungsten, gold and titanium. Gate electrode 57 includes the portion of conductor 56 overlying region 34. Electrode 57 depletes the region of semiconductor material 72 of available free-charges for a distance 78 beneath contact 57. This action takes places because of the difference in the electron affinity of the Schottky metal 57 and the semiconductor at the barrier surface 71. The resulting depletion region automatically exists under zero bias potential conditions. The depth of this depletion region can be varied by varying the magnitude of the potential applied to contact 57.

For instance, a negative potential of sufficient magnitude applied to gate electrode 57 causes the depletion region to extend down to top surface 80 of semi-insulating substrate material 83 to form the depletion region bounded by line 82 which renders a portion of device 30 nonconductive. The potential necessary to cause this occurrence is defined as the pinch-off voltage ($V_p$). When pinched-off, the resulting depletion in carriers make a very high-resistance region bounded by line 82 in semiconductor material 72 between ohmic contacts 38 and 42 thereby rendering at least a portion of device 30 mostly nonconductive Alternatively, a more positive potential applied to contact 57 decreases the depth of the zero bias depletion region 78 thereby increasing the conductivity of the portion of the path underlying gate electrode 57 between ohmic contacts 38 and 42 thereby rendering at least a least a portion of device 30 more conductive. Hence, a zero bias or positive potential on gate 57 provides an "on state" and a negative potential on gate 57 provides the "off state" for the portion of device 30 under electrode 57.

The magnitude of the resistance of each of resistive elements 32, 34 and 36 is also determined by the geometry and material properties of the active semiconductor region. More specifically, the resistance of any particular path can be given to a first order as:

$$R = \frac{(rho) * L}{A} \qquad \text{Equation (1)}$$

where (rho) is the bulk resistivity of the active semiconductor material, L is the distance between ohmic contacts and A is the cross-sectional area of the active semiconductor region. The bulk resistivity of semiconductor 72 can be estimated to a first order as:

$$(rho) = \frac{L}{q\, u_o\, N} \qquad \text{Equation (2)}$$

where q is an electronic charge, $u_o$ is the low-field mobility of the semiconductor material and N is the free carrier density of the semiconductor. The cross-sectional area of the active semiconductor is the product of the active region depth times the active region width. Maximum active region depth is the dimension illustrated by distance 84 of FIG. 3, for instance. The dimension L for the series resistance element 34 of FIG. 2 is labeled "LT" and for each shunt resistance element 32 and 34 is labeled "LS". In FIG. 2, the maximum active region width is labeled "WT" for the series resistive element and "WS" for each of the shunt resistive elements 32 and 36.

Shunt gate electrodes 94, 96, 102, 104, 110, and 112, and series gate electrodes 57, 114, and 115 are connected to or integral with one of gate control lines 50, 52, 54 and/or 56. Each of these gate electrodes make rectifying contact to all the underlying semiconductor material of elements 32, 34 or 36.

Each gate electrode operates to modify the resistance between the ohmic contacts at the ends thereof by changing the conducting cross-sectional area of the underlying semiconductor material. For normal operating conditions, each of these electrodes will be biased at one of two voltages levels. One of these voltage levels corresponds to a digital "one". When a gate electrode receives this bias level, the underlying semiconductor material is in the "on state". Current can then flow in the semiconductor material beneath the rectifying electrode. For depletion mode GaAs MESFET technology commonly used for MMIC circuits this digital "1" voltage is preferably 0.0 volts.

Another voltage level corresponds to a digital "0". When a gate electrode is at this bias level, the underlying semiconductor is in the "off state" and current cannot flow underneath the electrode. For the depletion mode GaAs MESFET technology, this digital "0" voltage is equal to or more negative than the pinch off voltage, $V_p$. The pinch off voltage of the material is a function of the doping density of the semiconductor material and the depth of the active region. For GaAs MESFET technology, the voltage level, $V_p$, can be expressed approximately as:

$$V_p = -\frac{qNa^2}{2(eps)} + V_{bi} \quad \text{Equation (3)}$$

where a is the active semiconductor region depth, (eps) is the dielectric constant of the material and $V_{bi}$ is the built-in potential of the rectifying contact which is typically about 0.8 volts.

Control line 50 includes a conductive element 90 which is integral with and perpendicular to conductive element 92. Conductive element 92 is integral with gate electrode 94 having a dimension W3S extending over first shunt semiconductor material 32. Conductive element 92 also is integral with another gate electrode 96 also having a dimension W3S extending over shunt resistive semiconductor material 36. Control line 52 also has perpendicular conducting elements 98 and 100. Element 100 is integral with gate electrode 102 of a width W2S extending over shunt semiconductor material 32, and gate electrode 104 having a width of W2S extending over semiconductor material 36. Element 98 is integral with gate electrode 115 having a width of W2T extending over semiconductor material 34. Similarly, control line 54 includes perpendicular conductive elements 106 and 108. Element 108 is integral with gate electrode 110, having a width W1S extending over semiconductor material 32, and another gate electrode 112 also of width W1S but extending over semiconductor material 36. Element 106 is integral with gate electrode 114 of width W3T extending over semiconductor material 34. Furthermore, control line 56 includes only one element which is integral with gate electrode 57 of width W4T extending over semiconductor material 34.

When a digital "0" control voltage is applied to control line 56 and digital "1's" are applied control lines 50, 52 and 54, device 30 of FIG. 1 provides maximum attenuation between terminals 40 and 44. In this case, the shunt resistance paths 32 and 34 are not constricted and current can flow beneath gate electrodes 94, 102 and 110 of shunt resistance 32 and beneath electrodes 96, 104 and 112 of shunt resistance 36. Series resistance path 34, however, is constricted significantly by gate electrode 57. Because the semiconductor region underneath electrode 57 is pinched-off, current can only flow around the end of this electrode. The effective cross-sectional area for current flow is therefore the product of the depth of the depletion region, 78, of FIG. 2, times the unconstricted region width. From FIG. 2, the unconstricted width is W=WT—W4T, where WT is indicated by reference number 120. Under this biasing condition, the series resistance value will be at a maximum. More specifically, this combination of maximum series resistance and minimum shunt resistance produces a maximum attenuation between terminals 40 and 44.

When either control line 52 or 54 receives the "on state" or digital "1" voltage while the remainder of the control lines are receiving the "off state" voltage, device 30 will be in an intermediate attenuation magnitude setting, for instance.

The actual magnitudes or values of the resistances provided by the semiconductor elements 32, 34 and 36 are tailored by control of the semiconductor doping density, active channel depth and appropriate device dimensions. The resistance values corresponding to each allowed digital state are chosen so that specific amounts of attenuation and optimum matching is achieved. More specifically, Table 1 represents optimum resistance values for the resistances of both shunt resistive elements 32 and 36 being equal to each other and to $R_1$, and resistive element 34 having a resistance equal to $R_2$. Specific amounts of attenuation are shown for matching to a 50 ohm system:

TABLE 1

| ATTENUATION (dB) | R1 (ohms) | R2 (ohms) |
|---|---|---|
| 1.0 | 872.0 | 5.8 |
| 3.0 | 292.2 | 17.6 |
| 6.0 | 150.5 | 37.4 |
| 9.0 | 104.0 | 61.5 |
| 12.0 | 83.5 | 93.2 |
| 15.0 | 71.6 | 136.1 |
| 18.0 | 64.4 | 195.3 |

Figure 4:
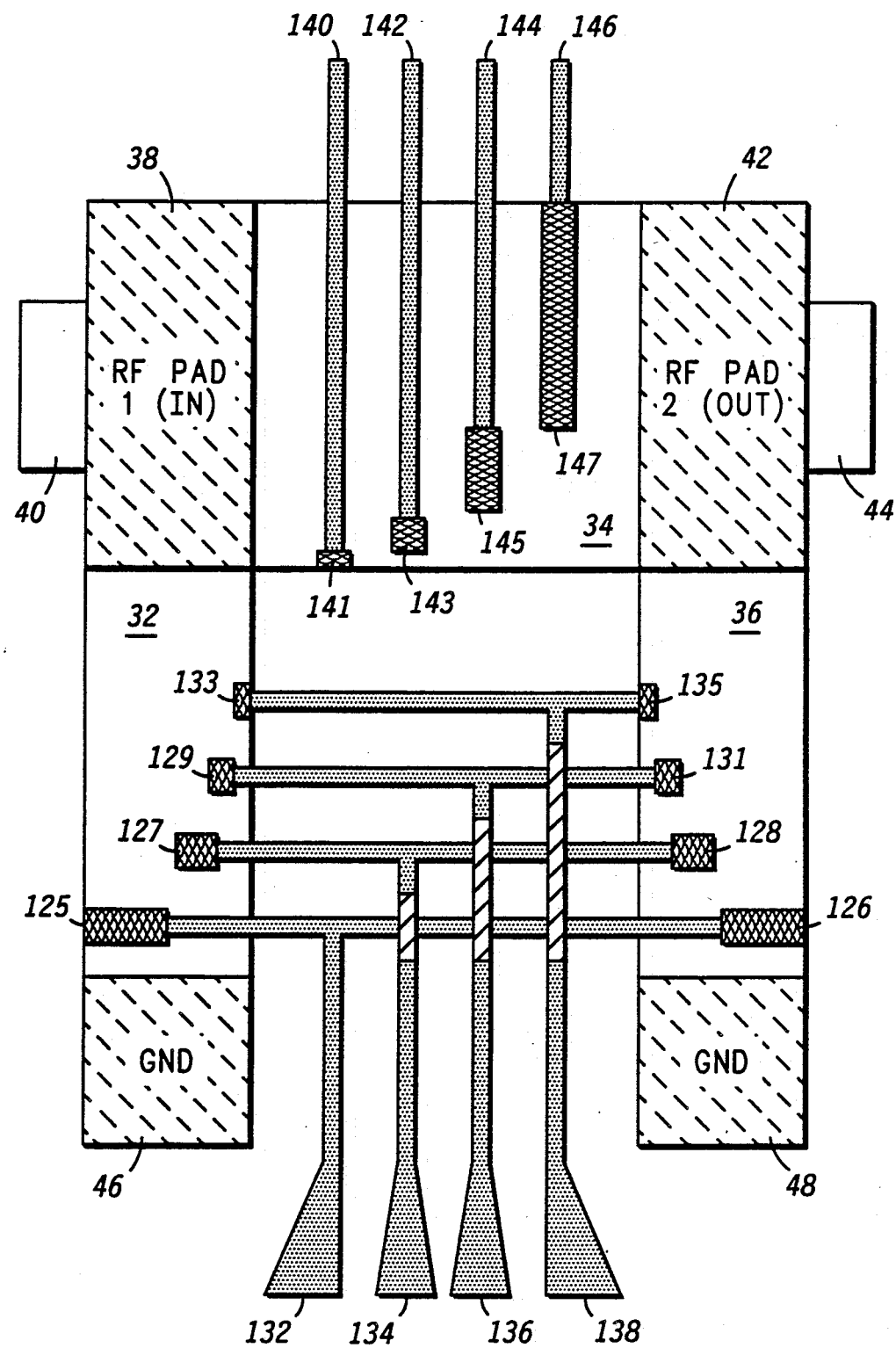
FIG. 4 is a top view of another field effect attenuator.

FIG. 4 shows the top view of an alternative embodiment of a digitally controlled RF attenuator device 130. The basic principles of operation of device 130 are identical to those previously described with respect to the operation of device 30 of FIGS. 2 and 3. Device 130 also provides a Pi network equivalent to circuit 10 of FIG. 1. Deice 130 has a different arrangement than device 30 for the control lines and gate electrodes. Otherwise, the structure of device 130 can be identical to that previously described with respect to device 30.

More specifically, device 130 includes gate electrode control lines 132, 134, 136 and 138 which are integral with and operate gate electrodes 125, 126, 127, 128, 129, 131, 133 and 135 to modify the shunt resistance values represented by semiconductor elements 32 and 36. Control lines 140, 142, 144 and 146 respectively control gate electrodes 141, 143, 145 and 147 to modify the equivalent series resistance value of semiconductor element 34. Only the gate electrodes of device 130 make rectifying contact to the underlying semiconductor material. The control voltages provided by these control lines can individually place this associated gate regions in the "on state" or in the "off state". The control lines 140, 142, 144 and 146 allow the series resistance value to be set at thirty-two different resistance values. Likewise, the four control lines 132, 134, 136 and 138 operate the gate electrodes connected thereto to set each of shunt resistive elements 32 and 36 to thirty-two different resistance values. A larger number of control lines is easily added to device 130. Device 130 requires more complex digital coding the device 30, but device 130 offers considerably more versatility than attenuator device 30.

Intermodulation distortion results from the creation of unwanted frequency components because of the nonlinear transfer characteristic of the device. Intermodulation tends to be worse when a channel is partially pinched-off in response to a non-zero bias or control voltage. In the present devices 30 and 130, the portions of the channel underlying the gate electrodes can be either totally pinched-off in response to a negative control voltage, $V_p$, or conductive in response to a zero level control voltage. Hence, devices 30 and 130 tend to provide a minimum amount of intermodulation distortion thereby reducing spurious responses. Moreover, the structures of devices 30 and 130 are arranged so as to reduce the parasitic capacitance thereof.

What has been described are attenuator devices 30 and 130 which respond to various digital signals for providing various predetermined amounts of attenuation. Since devices 30 and 130 are digitally operative, they do not suffer from the problems associated with analog attenuators such as being undesirably overly sensitive to noise, aging and changes in device parameters brought about by processing. Moreover, the attenuators 30 and 130 can be provided in MMIC structures and don't require the complex magnitude compensation circuits often associated with prior art solutions. This represents a significant savings in terms of size and power consumption Moreover, the reduced parts counts of devices 30 and 130 increase reliability.

Furthermore, since the channel portions underlying the gate electrodes of devices 30 and 130 can be either completely pinched-off or conductive at the zero voltage level, devices 30 and 130 provide less intermodulation distortion than other types of attenuator circuits utilizing FETs which are operated by non-zero control voltages in the partially pinched-off mode. Furthermore, devices 30 and 130 structures are arranged to have minimum of parasitic capacitance thereby facilitating the high speed operation for which GaAs MMIC circuits are well suited.

While the invention has been particularly shown and described with reference to preferred embodiments, those skilled in the art will understand that changes in form and details may occur therein without departing from the scope of the present invention.

We claim:

1. A variable field effect attenuator device suitable for providing different predetermined magnitudes of attenuation in response to digital control signals, the field effect attenuator device including in combination:
   an input electrode;
   an output electrode;
   a first semiconductor region providing a current path having width, length and depth dimensions, said current path having a controllable conductivity and coupling said input electrode and said output electrode, said first semiconductor region having a first end and a second end;
   a first plurality of gate electrodes each having portions with different selected lengths positioned to control the conductivity of said first semiconductor region; and
   a plurality of gate control lines each selectively connected to one of said first plurality of gate electrodes for selectively applying the digital control signals to said portions thereof to vary the amount of attenuation provided between said input and output electrodes to thereby provide the different predetermined magnitudes of attenuation in response to different digital control signals.

2. The attenuator device of claim 1 wherein said first plurality of gate electrodes extend over said first semiconductor region perpendicular to said length dimension of said current path for allowing the digital control signals to control said width and said depth dimensions of said current path.

3. The attenuator device of claim 1 further including:
   reference potential conductor;
   a second semiconductor region electrically coupled between one of said first and second ends of said first semiconductor region and said reference potential conductor;
   a second plurality of gate electrodes positioned to control the attenuation of said second semiconductor region; and
   means selectively connecting said gate control lines to said second plurality of gate electrodes.

4. The attenuator device of claim 3 wherein said second plurality gate electrodes includes gate electrodes having different selected lengths.

5. The attenuator device of claim 3 further including:
   a third semiconductor region coupled between the other of said first and second ends of said first semiconductor region and said reference potential conductor; and
   a third plurality of gate electrodes positioned to control the attenuation of said third semiconductor region; and
   means selectively connecting said gate control lines to said third plurality of gate electrodes.

6. The attenuator device of claim 5 wherein said third plurality of gate electrodes includes gate electrodes having different selected gate lengths.

7. The attenuator device of claim 6 wherein one of said gate control lines interconnects some of said second plurality of gate electrodes of said second semiconductor region and some of said third plurality of gate electrodes of said third semiconductor region.

8. The attenuator device of claim 6 wherein said gate control lines interconnect said first plurality of gate electrodes of said first semiconductor region, said second plurality of gate electrodes of said second semiconductor region and said third plurality of gate electrodes of said third semiconductor region.

9. The attenuator device of claim 1 having gate control lines connected only to said first plurality of gate electrodes of said first semiconductor region.

10. The attenuator device of claim 5 having:
    first gate control line means interconnecting said second plurality of gate electrodes of said second semiconductor region and said third plurality of gate electrodes of said third semiconductor region; and
    second gate control line means connected to each of said first plurality of gate electrodes of said first semiconductor region.

11. The attenuator device of claim 1 being provided in monolithic microwave integrated circuit form.

12. A variable field effect attenuator circuit suitable for being provided in monolithic integrated circuit form including in combination:
    input electrode means;
    output electrode means;
    reference potential conductor means;

first active semiconductor region coupled between said input electrode and said reference potential conductor means;

second active semiconductor region coupled between said input and said output electrodes;

third active semiconductor region coupled between said output electrode and said reference potential conductor means;

a first plurality of gate electrodes each having a portion arranged to operate with said first active semiconductor region, said portions of said first plurality of gate electrodes having different lengths;

a second plurality of gate electrodes each having a portion arranged to operate with said second active semiconductor region, said portions of said second plurality of gate electrodes having different lengths;

a third plurality of gate electrodes each having a portion arranged to operate with said third active semiconductor region, said portions of said third plurality of gate electrodes having different lengths; and a plurality of gate control lines connected to selected ones of said gate electrodes for applying digital control signals thereto, all of said portions of said gate electrodes being adapted to respond to said control signals to control the magnitude of the attenuation between said input and output electrode means.

13. The field effect attenuator of claim 12 wherein:

each of said first plurality, said second plurality and said third plurality of gate electrodes include gate electrode portions with a smallest length, an intermediate length and a longest length; and one of said gate control lines connecting said gate electrode of said first plurality having said portion with said longest length to said gate electrode of said third plurality having said longest length, and a plurality of gate control lines connected solely to each of said second plurality of gate electrodes.

14. The attenuator circuit of claim 12 being provided in monolithic microwave integrated circuit form.

15. The attenuator device of claim 1 wherein:

the digital control signal is comprised of two digital states;

said gate electrodes portions extending over said first semiconductor region; and each of said gate electrode portions responding to one of said digital states to normally completely pinch-off the part of said first semiconductor region underlying said gate electrode portion responding to said one of said digital states.

* * * * *

UNITED STATES PATENT AND TRADEMARK OFFICE
CERTIFICATE OF CORRECTION

PATENT NO. : 5,001,524

DATED : March 19, 1991

INVENTOR(S) : John M. Golio et al.

It is certified that error appears in the above-identified patent and that said Letters Patent is hereby corrected as shown below:

In column 8, claim 6, line 36, delete "gate".
In column 10, claim 15, line 19, delete "electrodes" and substitute --electrode--.

Signed and Sealed this

Twenty-second Day of September, 1992

*Attest:*

DOUGLAS B. COMER

*Attesting Officer*    *Acting Commissioner of Patents and Trademarks*